United States Patent [19]
Wicker et al.

[11] Patent Number: 5,863,376
[45] Date of Patent: Jan. 26, 1999

[54] TEMPERATURE CONTROLLING METHOD AND APPARATUS FOR A PLASMA PROCESSING CHAMBER

[75] Inventors: Thomas E. Wicker, Vallejo; Joel M. Cook, Pleasanton; Robert A. Maraschin, Cupertino; William S. Kennedy, Redwood Shores; Neil Benjamin, Palo Alto, all of Calif.

[73] Assignee: Lam Research Corporation, Fremont, Calif.

[21] Appl. No.: 658,259

[22] Filed: Jun. 5, 1996

[51] Int. Cl.⁶ .................................................... H05H 1/00
[52] U.S. Cl. .......................................... 156/345; 118/723 I
[58] Field of Search ............................. 118/723 I, 723 R; 156/345

[56] References Cited

U.S. PATENT DOCUMENTS

| | | | |
|---|---|---|---|
| 4,340,462 | 7/1982 | Koch | 156/345 X |
| 4,579,618 | 4/1986 | Celestino et al. | 156/345 |
| 4,948,458 | 8/1990 | Ogle | 156/345 X |
| 4,960,488 | 10/1990 | Law et al. | 156/345 X |
| 5,021,121 | 6/1991 | Groechel et al. | 156/643.1 |
| 5,074,456 | 12/1991 | Degner et al. | 156/345 X |
| 5,198,718 | 3/1993 | Davis et al. | 313/359.1 |
| 5,200,232 | 4/1993 | Tappan et al. | 118/719 X |
| 5,241,245 | 8/1993 | Barnes et al. | 315/111.41 |
| 5,262,029 | 11/1993 | Erskine et al. | 156/345 X |
| 5,304,279 | 4/1994 | Coultas et al. | 156/345 |
| 5,346,578 | 9/1994 | Benzing et al. | 156/345 |
| 5,401,350 | 3/1995 | Patrick et al. | 156/345 |
| 5,405,480 | 4/1995 | Benzing et al. | 156/345 |
| 5,464,476 | 11/1995 | Gibb et al. | 118/723 I |
| 5,525,159 | 6/1996 | Hama et al. | 118/723 I |
| 5,529,657 | 6/1996 | Ishii | 156/345 |
| 5,531,834 | 7/1996 | Ishizuka et al. | 118/723 I |
| 5,580,385 | 12/1996 | Paranjpe et al. | 118/723 I |

FOREIGN PATENT DOCUMENTS

| | | |
|---|---|---|
| 0489407 A2 | 6/1992 | European Pat. Off. . |
| 0520519 A1 | 12/1992 | European Pat. Off. . |

*Primary Examiner*—Thi Dang
*Attorney, Agent, or Firm*—Burns, Doane, Swecker & Mathis, LLP

[57] ABSTRACT

A plasma processing chamber includes a substrate holder and a dielectric member such as a dielectric window or gas distribution plate having an interior surface facing the substrate holder, the interior surface being maintained below a threshold temperature to minimize process drift during processing of substrates. The chamber can include an antenna which inductively couples RF energy through the dielectric member to energize process gas into a plasma state. The antenna can include a channel through which a temperature controlling fluid, which has been cooled by a closed circuit temperature controller, is passed. The control of the temperature of the interior surface minimizes process drift and degradation of the quality of the processed substrates during sequential batch processing of substrates such as during oxide etching of semiconductor wafers.

23 Claims, 5 Drawing Sheets

TEMPERATURE CONTROLLING METHOD AND APPARATUS FOR A PLASMA PROCESSING CHAMBER

FIELD OF THE INVENTION

The invention relates to a plasma processing chamber and to a method of controlling the temperature of a plasma processing chamber. More particularly, the invention relates to a method and processing chamber for cooling an interior surface facing a substrate to prevent process drift when multiple substrates are processed consecutively.

BACKGROUND OF THE INVENTION

Vacuum processing chambers are generally used for chemical vapor depositing (CVD) and etching of materials on substrates by supplying process gas to the vacuum chamber and application of an RF field to the gas. Examples of parallel plate, transformer coupled plasma (TCP, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; and 5,401,350. In such systems, the antenna is located outside the process chamber and the RF energy is supplied into the chamber through a dielectric window. Such processing systems can be used for a variety of semiconductor processing applications such as etching, deposition, resist stripping, etc.

SUMMARY OF THE INVENTION

An object of the present invention is to overcome the problem of process drift and degradation of the quality of the processed substrates when substrates are processed continuously by controlling the temperature of an interior surface facing the substrate. The temperature control of the interior surface facing the substrate allows substrates to be processed consecutively with minimal process drift.

According to one aspect of the invention, a method is provided for controlling the temperature of an interior surface of a dielectric member forming a wall of a plasma processing chamber. In the method, RF energy is inductively coupled through the dielectric member and the interior surface faces a substrate holder for holding a substrate. The method includes cooling the interior surface such as by passing a temperature controlling fluid in heat transfer contact with the dielectric member to maintain the interior surface below a threshold temperature and consecutively processing substrates while maintaining the interior surface below the threshold temperature. The threshold temperature can be less than or equal to 90° C. during processing such as oxide etching. The dielectric member can be a chamber component such as a gas distribution plate or a dielectric window.

According to a preferred embodiment of the invention, the dielectric member comprises a dielectric window or combination window/gas distribution plate and the temperature controlling fluid is a liquid passed through a channel in an RF antenna separated from the interior of the chamber by the window. The temperature controlling fluid is preferably a dielectric liquid and the interior surface is preferably maintained at a temperature of less than or equal to 80° C.

According to another aspect of the invention, a plasma processing chamber is provided which includes a substrate holder for holding a substrate within the processing chamber, a dielectric member having an interior surface facing the substrate, a gas supply supplying process gas to the processing chamber, and a cooling mechanism which cools the dielectric member such as by passing temperature controlling fluid in heat transfer contact with the dielectric member to cool the interior surface below a threshold temperature.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

In plasma etching of substrates, the process results depend on the etch rate, the etch profile, and the etch selectivity, each of which may change as a function of the number of wafers which have been etched consecutively. This change in process results is referred to as process drift. Process drift causes the process results to drift out of a "process window" within which the specifications of the resulting substrate are acceptable for their intended purpose. When process drift occurs and the process results drift out of the "process window" the processed substrates are not within specifications and cannot be used.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. The etch selectivity, which is the etch rate of the layer to be etched compared to the photoresist etch rate is preferably around 4:1 or higher. The etch selectivity of the oxide layer compared to the underlayer is preferably greater than the oxide:photoresist etch selectively, e.g., 40:1. These etch selectivities can change during consecutive processing of substrates due to the temperature increase of the processing chamber. For instance, when the chamber heats to above 80° C. during oxide etching, a reaction can occur wherein $CF_3$ forms $CF_2$ and HF with the $CF_2$ leading to increased polymer deposition causing process drift. The same problem may occur for other processes such as deposition reactions or resist stripping wherein chemical interactions with a masked layer cause polymer deposition. Such deposits are undesirable since they can lead to nonuniform processing of the wafers, a problem which worsens as more wafers are processed.

Processing chambers for etching layers such as oxide, metal, polysilicon, resist, etc., and film deposition processes generally include a substrate support having an RF biasing electrode, and a clamp for holding the substrate on the support when He backside cooling is performed. Substrate supports are generally liquid cooled to prevent an increase in temperature of the substrate above acceptable levels. However, in processing chambers having an interior chamber surface such as a dielectric window or gas distribution plate in proximity to and facing the processed surface of a substrate, the chamber surface may heat up during processing of substrates and cause undesirable process drift owing to changes in the etch chemistry arising from this temperature change.

In a high density plasma etching reactor (e.g., inductively coupled, transformer coupled, helicon, etc.), the etch rate of the oxide and the etch selectivity can also change as the number of substrates which have been continuously etched increases due to an increase in the temperature of the chamber. The etch rate of the oxide decreases due to the increase in temperature of the chamber until eventually the etching may stop. The etch selectivity, which is the etch rate of the layer to be etched compared to that of the photoresist or underlying layer also changes due to the increasing temperature in the processing chamber.

According to the invention, an interior surface of a dielectric member above the substrate is temperature controlled to minimize the process drift problem. The invention is especially useful for preventing process drift during etching of dielectric materials such as silicon dioxide (e.g., doped or undoped TEOS, BPSG, USG (undoped spin-on-glass), thermal oxide, plasma oxide, etc.) typically overlying a conductive layer such as silicon, polysilicon, silicide, titanium nitride, aluminum or a non-conductive material such as silicon nitride. According to the invention, process drift can be minimized to such an extent that features (such as contact holes, vias, trenches, etc.) can be provided having dimensions of 0.5 μm and below and aspect ratios ranging from 2:1 to 7:1 can be consistently maintained from substrate to substrate during sequential batch processing of substrates such as semiconductor wafers (e.g., 25 or more consecutive wafers).

Figure 1:
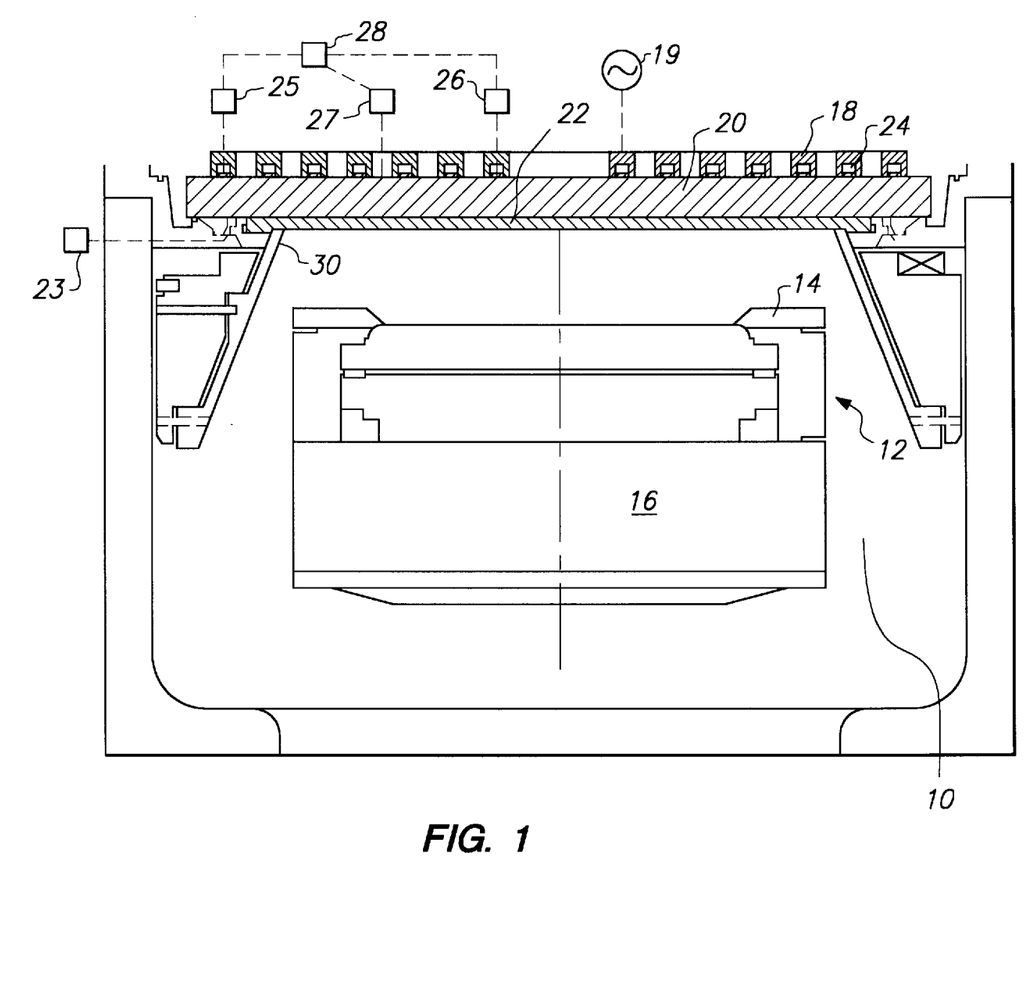
FIG. 1 is a cross sectional view of a vacuum processing chamber having an antenna cooling mechanism according to the present invention.

A vacuum processing chamber according to one embodiment of the present invention is illustrated in FIG. 1. The vacuum processing chamber 10 includes a substrate holder 12 providing an RF bias to a substrate supported thereon and a mechanical clamp 14 for clamping the substrate while it is He backcooled. A source of energy for maintaining a high density (e.g. $10^{11}$–$10^{12}$ ions/cm$^3$) plasma in the chamber such as an antenna 18 powered by a suitable RF source and suitable RF impedance matching circuitry inductively couples RF energy into the chamber 10 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. However, the gas distribution plate 22 can be omitted and process gas can be supplied to the chamber by other arrangements such as gas rings, etc. The antenna 18, according to one embodiment of the present invention, is provided with a channel 24 through which a temperature control fluid is passed via inlet and outlet conduits 25,26. However, the antenna 18 and/or window 20 could be cooled by other techniques such as by blowing air over the antenna and window, passing a cooling medium through or in heat transfer contact with the window and/or gas distribution plate, etc.

Figure 2:
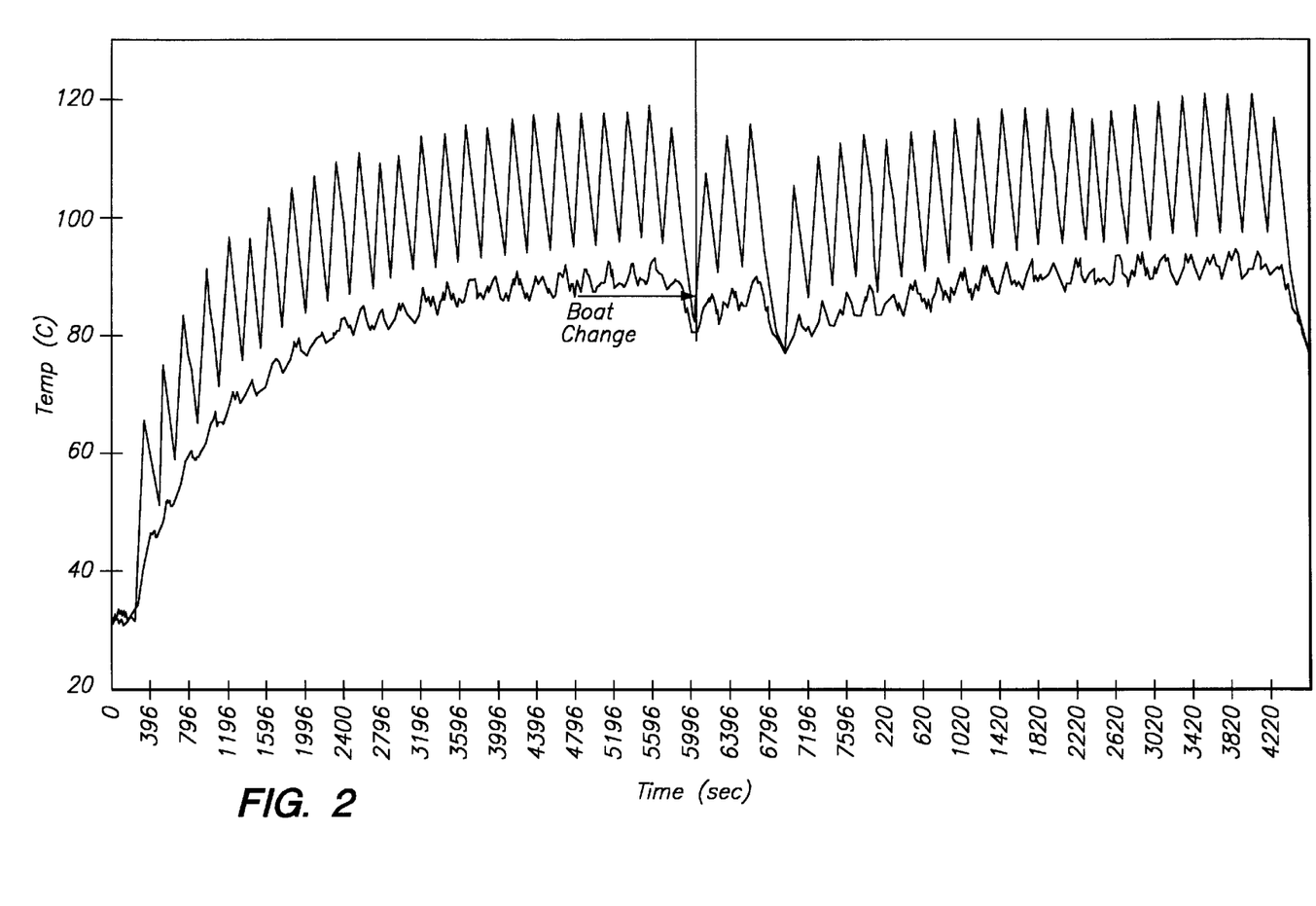
FIG. 2 is a temperature versus time graph which illustrates process drift which occurs in a processing chamber without the antenna cooling mechanism.
Figure 3A:
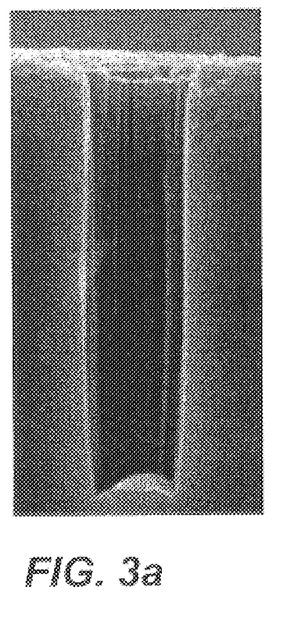
FIGS. 3a–f are photomicrographs of oxide etch profiles for the 2nd, 6th, 12th, 25th, 42nd and 50th wafers of two consecutive runs of 25 wafers etched during the processing illustrated in FIG. 2.
Figure 3B:
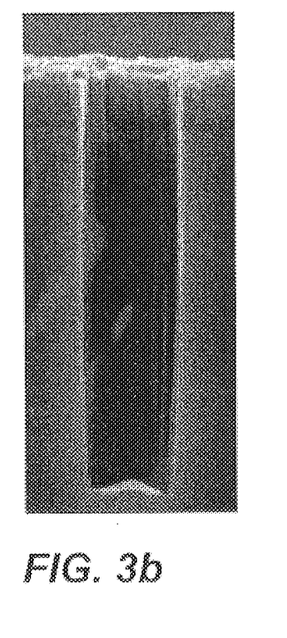
Figure 3C:
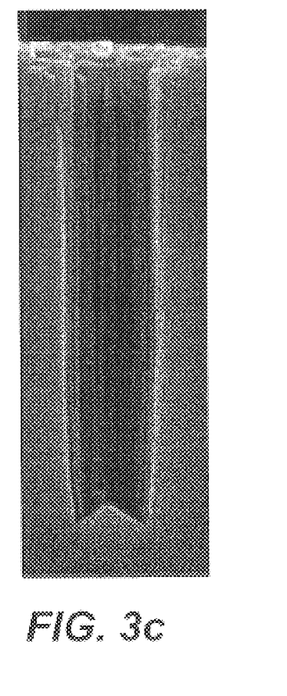
Figure 3D:
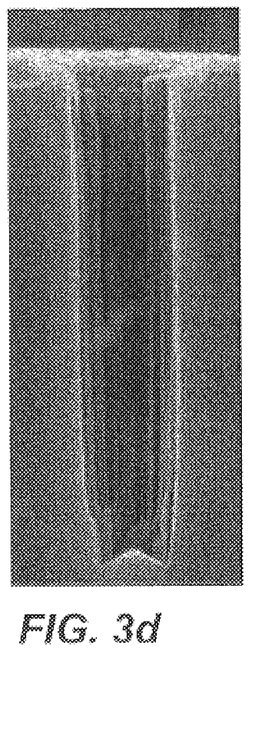
Figure 3E:
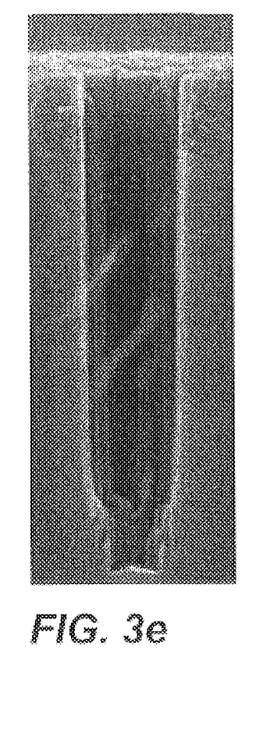
Figure 3F:
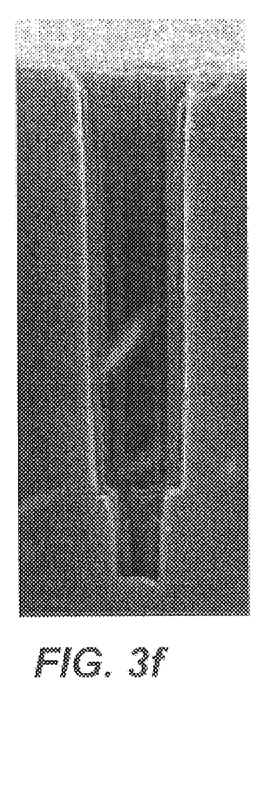

During plasma etching of semiconductor substrates in an inductively coupled plasma reactor system without temperature control of the window, the etch profile, which is the shape of the etch walls, may change due to temperature increases which occur within the processing chamber during the etching process. FIG. 2 is a graph of time versus temperature which illustrates the effect of process drift on an oxide etch profile. As shown in FIGS. 3a–f, the etch profiles of the etched substrates which are shown in the six photomicrographs change over time when substrates are processed consecutively. At the beginning of the process the second (FIG. 3a) and sixth substrates (FIG. 3b) to be etched have etch walls which are seen in cross section to be almost vertical. As the process moves on to the 12th (FIG. 3c) and 25th (FIG. 3d) substrates to be etched, the etch walls are less vertical. After twenty five substrates had been processed in the test illustrated in FIG. 2, the process was delayed for a boat (i.e., wafer cassette) change and a transfer module reset. These delays caused breaks in the continuous processing of the substrates and resulted in the temperature drops shown on the graph. After the boat change and transfer module reset, the temperature of the processing chamber and the process window continued to rise. As can be seen from the cross sections of the 42nd (FIG. 3e) and 50th (FIG. 3f) substrates, the etch profile of these substrates was distorted to a great degree. With such distortion of the etch profile, the contact holes which are being etched may not be etched completely through the oxide layer to the underlayer. The failure to etch all the way through the oxide layer can lead to final integrated circuit chips which are inoperative.

Figure 4:
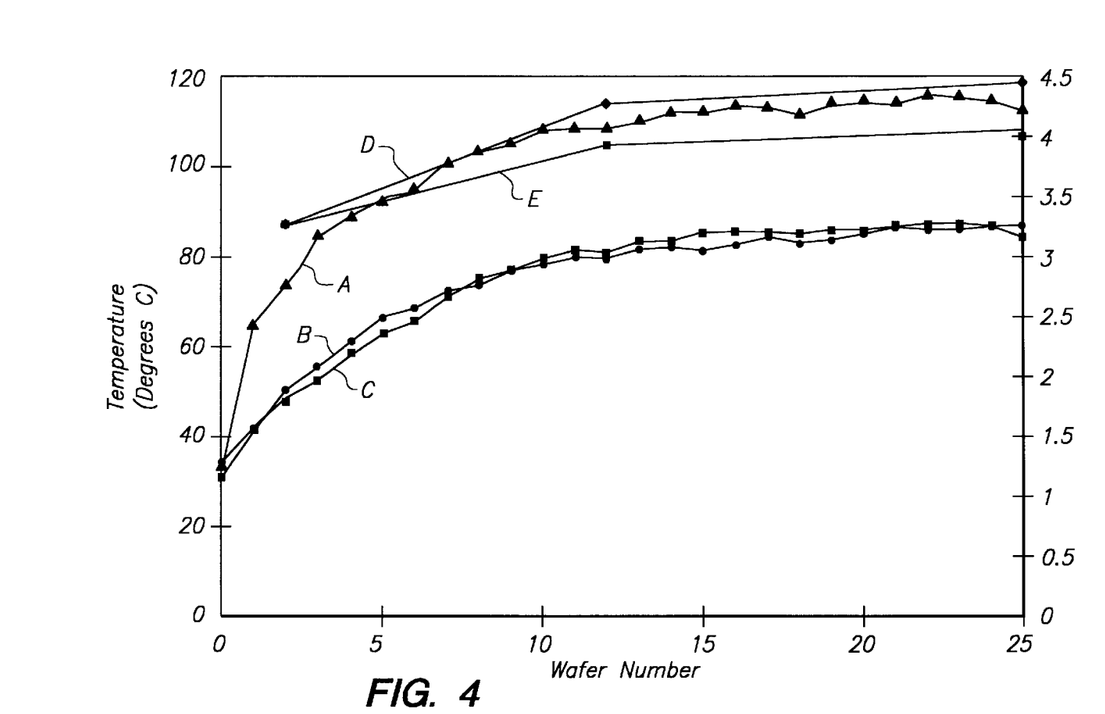
FIG. 4 is a graph of window temperatures in an apparatus as shown in FIG. 1 wherein the antenna is cooled with air blown against the antenna at 150 cubic feet per minute.

FIG. 4 is a graph of parameters in the apparatus shown in FIG. 1 during a run of 25 silicon semiconductor wafers wherein selectivities are shown on the right side of the graph and temperatures at various locations of an aluminum nitride window are shown on the left side of the graph. In accordance with the invention, the window was cooled by blowing air against the antenna and window at a rate of 150 cubic feet per minute. Curve A shows the temperature of the center of the window, curve B shows the temperature of an outer edge of the window and curve C shows the temperature at a location between the center and edge of the window. Curve D shows the selectivity at the center of the wafer and curve E shows the selectivity at an outer edge of the wafer.

The test results shown in FIG. 4 were carried out in an inductively coupled plasma reactor having an aluminum nitride window (similar to the arrangement shown in FIG. 1 but with a 10 inch hole in the center of the gas distribution plate to expose the window) cooled by passing air over a spiral antenna spaced 0.14 inch above an outer surface of the window. The antenna was supplied with 13.56 MHz RF power and the RF biasing electrode in the substrate support was supplied with 4 MHz RF power. After sequentially processing twenty-five wafers in the chamber, the window temperatures did not increase above 120° C. as shown in FIG. 3. The processing of the wafers included a 90 second oxide etch using 25 sccm $C_2HF_5$ and 15 sccm $CHF_3$ with 1100 watts applied to the antenna, 1300 watts applied to the bottom RF biasing electrode in the substrate support, a chamber pressure of 5 mTorr and the bottom electrode at −10° C. The oxide etch was followed by a 10 seconds ashing step using 750 sccm $O_2$ with 400 watts applied to the antenna and 100 watts applied to the RF biasing electrode and a chamber pressure of 15.5 mTorr followed by a second ashing step for 50 seconds using 750 sccm $O_2$ with 400 watts applied to the antenna and 40 watts RF biasing power. Ashing, however, was omitted on wafer Nos. 2, 6, 12, 18 and 25. Including transport and other overhead operations, the cycle time was about 230 seconds per wafer. Probes were used to measure the window temperature at radii of 0.68 inches and 5.68 inches.

Figure 5:
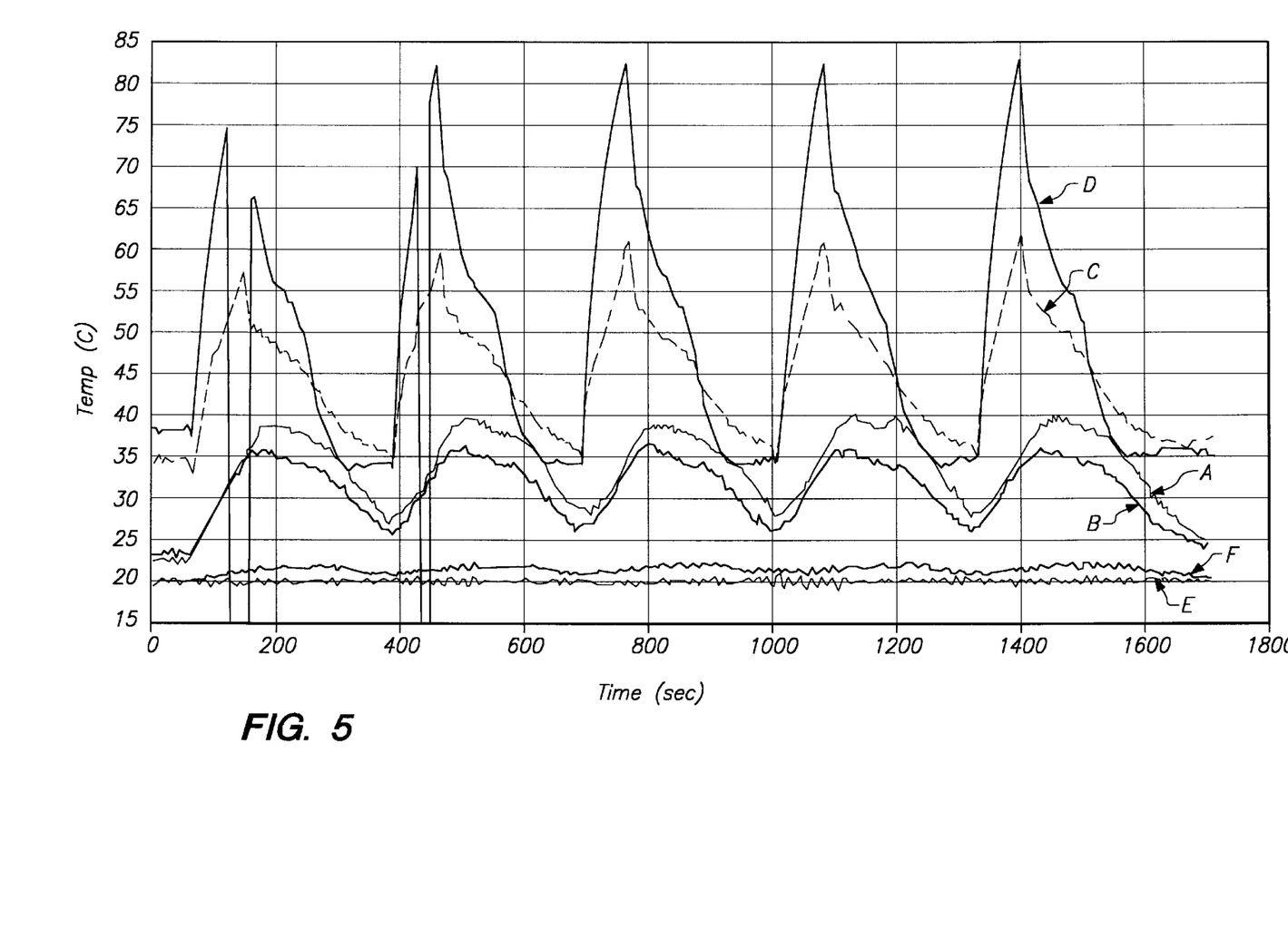
FIG. 5 is a graph of window and gas distribution plate temperatures in an apparatus as shown in FIG. 1 wherein the antenna is cooled by passing a liquid through the antenna.

FIG. 5 is a graph of window temperatures during a run of 5 wafers in the apparatus shown in FIG. 1. In accordance with the invention, the window was cooled by passing a dielectric liquid at about 20° C. through a channel in the antenna while powering the antenna at about 1850 watts and powering an RF biasing electrode in the substrate support at about 2100 watts. In FIG. 5, curve A shows the temperature at the center of the window, curve B shows the temperature at a distance of 2.75 inches from the center of the window, curve C shows the temperature at a distance of 0.5 inch from the center of the gas distribution plate, curve D shows the temperature at a distance of 3 inches from the center of the plate, curve E shows the temperature of coolant entering the antenna and curve F shows the temperature of coolant exiting the antenna.

In operation, a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22. A suitable gas distribution plate (i.e., showerhead) arrangement is disclosed in commonly owned U.S. pat. application Ser. No. 08/509,080, the disclosure of which is hereby incorporated by reference. For instance, while the window and gas distribution plate arrangement in FIG. 1 are planar and of uniform thickness, non-planar and/or non-uniform thickness geometries can be used for the window and/or gas distribution plate. A high density plasma is then ignited in the space between the wafer and the window by supplying suitable RF power to the antenna 18. A temperature control fluid is passed through the channel 24 in the antenna 18 to maintain the antenna 18, window 20 and gas distribution plate 22 at a temperature below a threshold temperature.

During oxide etching, the chamber pressure is typically below 300 mTorr, preferably 2–40 mTorr, the antenna is powered at 200–2000 watts, preferably 400–1600 watts, the RF bias is $\leq 2200$ watts, preferably 1200–2200 watts, and the He backpressure is 5–40 Torr, preferably 7–20 Torr. The process gas can include 10–200 sccm $CHF_3$, 10–100 sccm $C_2HF_5$ and/or 10–100 $C_2F_6$.

As explained earlier, process drift may lead to changes in the oxide etch rate, the etch profile, and the etch selectivities and such process drift results from buildup of heat in the processing chamber as multiple substrates are consecutively processed. It has been discovered that if the temperature of the window 20 and/or gas distribution plate 22 in contact with the plasma processing the substrate can be maintained below the threshold temperature, the process drift can be substantially reduced. The temperatures of other surfaces of the interior of the vacuum processing chamber 10 such as conical ring 30 can also be temperature controlled so as to be below the threshold temperature.

Temperature control of the gas distribution plate 22 can be provided by using channel 24 for circulating a fluid through the antenna 18 from a closed circuit temperature controller 28. The temperature controller preferably monitors the window temperature such as by one or more temperature sensors 27 and controls coolant temperature and/or flow rate of coolant through the antenna 18 to maintain the window below a threshold temperature. The antenna 18 is preferably in good thermal contact with the window 20 to provide adequate heat transfer between the window and the antenna 18. The window is preferably made of a high thermal conductivity dielectric material such as aluminum nitride which maximizes heat transfer from the antenna 18 through the window to the gas distribution plate 22. Properties of aluminum nitride include thermal conductivity of 100 W/m-k, density of 3.27 gm/cm$^3$, heat capacity of 0.2 cal/gm-k, and emissivity of 0.75. The gas distribution plate 22 is also preferably made of a material having a high thermal conductivity, such as, aluminum nitride but other dielectric materials such as aluminum oxide or quartz can also be used for the gas distribution plate 22. The heat which is received by the gas distribution plate 22 due to ion bombardment from the plasma is passed through the window 20 and can be removed by passing cooling fluid within the antenna 18, increasing gas pressure between the window and gas distribution plate 22 and/or blowing cooling gas over the antenna.

The antenna 18 can have various shapes and profiles such as a substantially planar profile and/or a spiral shape having one or more (e.g., 3 to 7) turns in the spiral. The channel 24 preferably extends through all portions of the antenna 18 from a cooling fluid inlet to a cooling fluid outlet. For instance, the cooling fluid may flow from the exterior of the spiral antenna 18 toward the center, or from the center to the exterior thereof. The antenna may be bonded to the window by any suitable technique such as brazing, adhesive (e.g., RTV), etc., which provides good heat transfer characteristics between the antenna and the window. The cooling fluid which is passed through the antenna is preferably a non-conducting liquid such as deionized water or Fluoroinert (a dielectric fluid made by DuPont).

According to an alternative embodiment of the present invention, the antenna can include a cooling tube which is bonded to a surface, such as a top surface, of the antenna. The cooling fluid is passed through the cooling tube in the same manner as the channel 24.

According to another alternative embodiment of the invention, the window 20 and the gas distribution plate 22 may be formed as a single piece. When formed as a single piece, higher thermal conductivity of the window/gas distribution plate 22 arrangement can be provided and/or the heat transfer across the window and the gas distribution plate 22 can be made more uniform. In making a single piece window/gas distribution plate, suitable gas passages and outlet holes can be provided in a green ceramic dielectric material which is later sintered to form a unitary plate. In order to prevent plasma from striking in the passages and/or holes, the dimensions of the passages and holes are preferably small enough to avoid conditions under which plasma would form during flow of process gas and powering of the antenna.

The temperature of the gas distribution plate 22 can be controlled by controlling the temperature of the circulating fluid in the antenna 18. The temperature of the gas distribution plate 22 is desirably maintained below a threshold temperature. For instance, in the case of oxide etching, the threshold temperature can be 120° C. or less, preferably 90° C. or less, and more preferably 80° C. or less such as by controlling the temperature of the circulating fluid with a closed circuit cooling system. The temperature of the window may also be controlled by modulating the pressure of the process gas behind the gas distribution plate 22 during the etching process. Additionally, the temperature may also be controlled by additional steps such as ashing steps in the process or during wafer transport which cause delays and allow cooling of the vacuum chamber and consequently the window/gas distribution plate 22 arrangement.

In the case where the dielectric window is between a gas distribution plate and the antenna, it may be desirable to locate the antenna such that portions thereof do not overlie any outlet holes in the gas distribution plate. For instance, if the antenna comprises a multi-turn coil and the gas distribution plate includes a center hole and 6 holes located on a circle at a fixed radius from the center hole, the antenna is preferably located such that any turn passing through the circle is located equally between a pair of adjacent holes located on the circle. Such positioning of the antenna would minimize the possibility of striking a plasma in the holes located closest to the antenna.

Dielectric plates used as windows into the vacuum environment of a process chamber are subject to atmospheric pressure of about $10^4 Kg/m^2$. This means that on a typical window plate with unsupported diameter, $\phi=40$ cm, the inward force totals about 1200 Kg. Therefore, a high strength material is required, otherwise the window will be excessively thick, e.g. allowing for a 5x safety factor for ceramic, this requires about 2 cm thickness for a quartz window with $\phi=40$ cm.

In general, process requirements may dictate that the inner surface of such a window be composed of a process compatible material, for its chemical and/or physical properties, e.g. quartz. This can therefore be prepared as a bulk window material, or prepared as a coating or bonded surface of sufficient thickness of some other material or composite structure, or prepared as a cover plate supported separately in the vacuum. The window design must be compatible with the structural requirements set forth above, or if a coating or bonding technique is employed, the composite structure will be susceptible to film tension effects in the growth or bonding process, and the possibility of differential thermal stress, and in the last case of a cover plate, a separate support structure may be required. Further, the process requirements may dictate that the surface temperature of the chamber walls possibly including the inner surface of any dielectric window or cover plate thereto affixed, be constrained, and possibly actively controlled.

Windows into process chambers are usually used for the transmission of energy into, or from the process chamber. For instance, power in the form of U-V, visible, I-R, microwave and RF E-M radiation are all transmitted into and from vacuum chambers using dielectric windows. If significant power is transmitted in this way, the dielectric may become heated by loss processes depending on the frequency ($\omega$), and the loss factor (tan $\delta$). Even if transmission loss heating is negligible, the window constitutes a wall of the process chamber and may be heated by radiation, convection and conduction processes from the components and process materials in the chamber. For instance, in plasma processing, where the window is used for power transmission from a TCP (transformer coupled plasma) coil antenna, several watts can be dissipated on every square cm of the window's inner surface. If the window is made of bulk quartz material 2 cm thick, this will result in an unavoidable temperature rise of the inner surface of several hundred ° C.

Quartz can be used as the window material since it is compatible with many process regimes and has good thermal shock resistance due to its low coefficient of thermal expansion. However, it only has moderate mechanical properties, extremely low thermal conductivity leading to high temperature gradients, and high differential expansion stress when in contact with materials having significantly different coefficients of thermal expansion. Materials having a combination of such properties can be utilized in a composite window according to a further aspect of the invention. Such a composite window can be provided with a process compatible material such as quartz as its inner surface and/or the window can be constructed in a manner such that the inner surface can be temperature monitored with the temperature thereof being passively or actively controlled.

It is desirable to choose the bulk material of the window for its vacuum compatibility, dielectric properties, relative process inertness, mechanical and thermal properties. For instance, aluminum nitride is fairly inert, has good dielectric properties (low dielectric constant and loss factor), has mechanical properties similar to alumina including thermal expansion, and thermal capacity, but has thermal conductivity approximately five times greater than alumina, i.e. two orders of magnitude greater than that of quartz. Thus, an aluminum nitride window similar to that described for bulk quartz with 100 =40 cm, can be <1 cm thick and still support the vacuum force safely. Such a window will only support a temperature gradient of about 1 ° C. across it for each watt/cm² dissipated, will have a rather short thermal time constant (seconds rather than minutes), and will therefore still be fairly good with regard to thermal shock. Moreover, it is possible to control the inside temperature of the window by monitoring the temperature of the outside and heating or cooling the outside selectively, since the inside surface will closely follow suit, unlike the case of a bulk quartz window for instance.

In some cases, aluminum nitride may not be compatible with processing carried out in the chamber. Therefore, a relatively thin, e.g., about 2 mm thick, sub-plate comprising one or more layers of which the exposed layer is of process compatible material can be supported in close proximity to the lower surface of, and concentric with the main window plate. Such a plate, even if made of quartz, for instance, will only account for a temperature differential across its thickness of some tens of degrees instead of hundreds of degrees as was the case for the 2 cm thick quartz window when subjected to the same thermal flux. An advantage of such an arrangement wherein the sub-plate is a simple thin disk of a single or composite material, is that it can be readily and relatively cheaply replaced when damaged, or consumed in the process.

With the above arrangement, the outside of the sub-plate may be separated from the outer window by a vacuum, and even though the plate is in close proximity to the outer window, it is not in intimate thermal contact with the main window plate, such that a large temperature differential could be built up across the interspace between them. However, a thin film of thermally conductive contact medium can be employed to minimize the temperature drop across the interspace. If the medium is fluid or elastic, excessive rigidity can be avoided, such that no large differential expansion forces will be set up.

Figure 6:
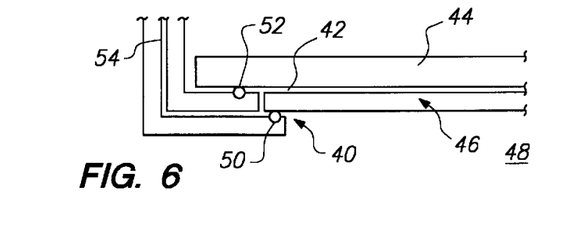
FIG. 6 is a cross section of a mounting arrangement for a dielectric window and gas distribution plate according to a further embodiment of the invention.

The mechanical support of such a sub-plate adjacent to the main window can be arranged, as shown in FIG. 6, such that there is only a small leakage path 40, if any, from the interspace 42 between the main window plate 44 and the sub-plate 46 into the chamber 48 proper, an elastomer edge seal 50,52 being provided if necessary for use with a fluid thermal contact medium. For instance, the interspace 42 can be filled with an inert thermal contact medium such as vacuum grease, a thin silicone rubber film, or most conveniently with a gas. If a gas is used as the thermal contact medium, the gas is preferably a light inert gas at a pressure which optimizes thermal conductance since the gas is not being used for convective transport, e.g., He at about 10 Torr, being typical, depending on gap dimensions and mean free path considerations. If a gas is the contact medium, an inlet, and, if required, an outlet also, are arranged such that the interspace 42 can be filled to the appropriate pressure via a suitable gas supply passage such as passage 54. Further, since there is no atmospheric pressure stress on the sub-plate 46 as that force is carried entirely by the main window plate 44, the He pressure which can be two orders or magnitude below atmospheric pressure must be supported by the sub-plate, or if grease or a film is used as the contact medium, provision can be made to vent any trapped or included gas and to allow for the relief of thermal expansion forces. Also, in the case where the sub-plate comprises a gas distribution plate, the contact medium can comprise the process gas or a gas added to the process gas. If desired, the openings in the gas distribution plate can be sized so as to optimize pressure in the interspace and improve heat transfer from the sub-plate to the main window. The gas pressure in the interspace between the window and gas distribution plate can be regulated within a range of 1–100 Torr.

The complete assembly consisting of a sandwich of main window plate, thin film of thermal conductor (be it semi-solid, or fluid), and sub-plate, will allow monitoring and temperature control of the inside surface facing the chamber by means of contact with the outside of the main window by virtue of the greatly improved thermal conductance between inside and outside surfaces when compared with a solid window of the sub-plate material, e.g. quartz, capable of performing the same structural function. The outside temperature can be monitored by standard thermometric techniques, both contacting and otherwise. Temperature control can be achieved using embedded, contact or radiant, heater elements, and/or forced fluid (liquid or gas) on the exposed surface of the main window. Simultaneous continuous direct temperature monitoring and precision control of the inside surface may not be possible from the outside alone, although knowledge of the thermal characteristics and recent history of the double plate window can be utilized. For instance, pulsing the feedback control system to observe the dynamic response of monitoring sensors in various positions on the window would be one technique, while another might employ sensors inserted into the main window sub-plate interspace.

While the invention has been described in detail with reference to specific embodiments thereof, it will be apparent to one skilled in the art that various changes and modifications can be made, and equivalents employed, without departing from the spirit and scope of the invention.

What is claimed is:

1. A plasma processing chamber comprising:
   a substrate holder for supporting a substrate within the processing chamber;
   a dielectric member having an interior surface thereof facing the substrate holder;
   a gas supply supplying process gas to the chamber;
   an RF energy source which inductively couples RF energy through the dielectric member and into the chamber to energize the process gas into a plasma state; and
   a cooling mechanism which cools the dielectric member and maintains the interior surface below a threshold temperature.

2. The plasma processing chamber according to claim 1, wherein the dielectric member comprises a dielectric window or gas distribution plate.

3. The plasma processing chamber according to claim 1, wherein the dielectric member comprises a gas distribution plate having a plurality of holes therethrough, the gas distribution plate supplies the process gas to the interior of the chamber and the gas supply supplies gas to the gas distribution plate.

4. The plasma processing chamber according to claim 1, wherein the chamber includes a dielectric window and the RF energy source comprises a substantially planar antenna adjacent the window, the antenna supplying RF power through the window to energize process gas in the processing chamber into a plasma state.

5. The plasma processing chamber according to claim 4, wherein the dielectric member comprises a dielectric gas distribution plate, the window being between the antenna and the gas distribution plate.

6. The plasma processing chamber according to claim 5, wherein the cooling mechanism passes a temperature controlling fluid in heat transfer contact with the antenna or the gas distribution plate.

7. The plasma processing chamber according to claim 1, further comprising a closed circuit cooling system which supplies an electrically nonconducting cooling liquid to the cooling mechanism and maintains the interior surface below the threshold temperature.

8. The plasma processing chamber according to claim 1, wherein the chamber includes a dielectric window and the RF energy source comprises an antenna adjacent the window, the antenna supplying RF power through the window to energize process gas in the processing chamber into a plasma state, the interior surface comprising an inner surface of the window and the cooling mechanism including a closed circuit temperature controller and a channel in the antenna through which a temperature controlling fluid is circulated.

9. The plasma processing chamber according to claim 8, wherein the fluid is a non-aqueous dielectric liquid.

10. The plasma processing chamber according to claim 1, wherein the chamber includes a dielectric window and an antenna adjacent the window, the antenna supplying RF power through the window to energize process gas in the processing chamber into a plasma state, the antenna having a substantially planar shape and the cooling mechanism comprising a liquid flow channel within the antenna.

11. The plasma processing chamber according to claim 10, wherein the dielectric member comprises a gas distribution plate adjacent the window, the gas distribution plate including gas outlets therein through which the process gas enters the interior of the chamber, the antenna being arranged such that the gas outlets are not directly between the substrate holder and the antenna.

12. The plasma processing chamber according to claim 1, wherein the dielectric member comprises a dielectric window having a substantially uniform thickness and substantially planar configuration.

13. The plasma processing chamber according to claim 1, wherein the dielectric member comprises a gas distribution plate having a substantially uniform thickness and substantially planar configuration.

14. The plasma processing chamber of claim 2, wherein the RF energy source is thermally coupled to the dielectric member and the dielectric member consists essentially of aluminum nitride or alumina.

15. The plasma processing chamber of claim 1, wherein the dielectric member comprises a unitary body of $Al_2O_3$ or AlN.

16. The plasma processing chamber of claim 1, wherein the dielectric member is in thermal contact with the RF energy source.

17. The plasma processing chamber of claim 1, wherein the plasma processing chamber comprises a plasma etching reactor and the cooling mechanism maintains the interior surface of the dielectric member at a temperature less than a temperature at which processs drift occurs.

18. The plasma processing chamber of claim 1, wherein the cooling mechanism includes one or more sensors monitoring the temperature of an exterior surface of the dielectric member and the cooling mechanism maintains the interior surface of the dielectric member below the threshold temperature based on output from the one or more sensors.

19. The plasma processing chamber of claim 1, wherein the dielectric member consists essentially of a material having thermal conductivity of at least 20 W/m-K.

20. The plasma processing chamber of claim 5, wherein the window comprises a unitary body of alumina or aluminum nitride and the gas distribution plate comprises a unitary body of alumina or aluminum nitride.

21. A plasma processing chamber comprising:
a substrate holder for supporting a substrate within the processing chamber;
a dielectric member having an interior surface thereof facing the substrate holder;
a gas supply supplying process gas to the chamber;
an RF energy source which inductively couples RF energy through the dielectric member and into the chamber to energize the process gas into a plasma state; and
a cooling mechanism which cools the dielectric member and maintains the interior surface below a threshold temperature,
wherein the dielectric member comprises a dielectric window having first and second sections separated from each other by a gap, the first section including an outer surface exposed to ambient pressure and the second section including the interior surface, the gap being filled with a heat transfer medium.

22. The plasma processing chamber of claim 21, wherein the heat transfer medium is a coolant and the cooling mechanism circulates the coolant in the gap.

23. A plasma processing chamber comprising:
a substrate holder for supporting a substrate within the processing chamber;
a dielectric member having an interior surface thereof facing the substrate holder;
a gas supply supplying process gas to the chamber;
an RF energy source which inductively couples RF energy through the dielectric member and into the chamber to energize the process gas into a plasma state; and
a cooling mechanism which cools the dielectric member and maintains the interior surface below a threshold temperature by introducing a coolant in the dielectric member.

* * * * *